United States Patent
Wu

(10) Patent No.: US 10,020,310 B2
(45) Date of Patent: Jul. 10, 2018

(54) MEMORY DEVICE AND FABRICATING METHOD THEREOF

(71) Applicant: Micron Technology, Inc., Boise, ID (US)

(72) Inventor: Tieh-Chiang Wu, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/671,471

(22) Filed: Aug. 8, 2017

(65) Prior Publication Data

US 2017/0358583 A1    Dec. 14, 2017

Related U.S. Application Data

(63) Continuation of application No. 14/848,357, filed on Sep. 9, 2015, now Pat. No. 9,735,161.

(51) Int. Cl.
*H01L 21/336* (2006.01)
*H01L 27/108* (2006.01)
*H01L 27/11582* (2017.01)

(52) U.S. Cl.
CPC .. *H01L 27/10823* (2013.01); *H01L 27/10876* (2013.01); *H01L 27/11582* (2013.01)

(58) Field of Classification Search
CPC ............................................. H01L 27/10876
USPC ........ 438/242, 258, 270, 589; 257/135, 302, 257/330
See application file for complete search history.

(56) References Cited

U.S. PATENT DOCUMENTS

| | | | |
|---|---|---|---|
| 6,395,597 B2 * | 5/2002 | Noble ................. | H01L 21/8242 438/242 |
| 6,479,366 B2 | 11/2002 | Miyamoto | |
| 6,531,377 B2 | 3/2003 | Knorr et al. | |
| 7,557,002 B2 | 7/2009 | Wells et al. | |
| 7,713,823 B2 | 5/2010 | Sung et al. | |
| 8,105,902 B2 * | 1/2012 | Shin .................. | H01L 27/10876 438/269 |
| 8,222,110 B2 | 7/2012 | Kim et al. | |
| 8,552,472 B2 | 10/2013 | Kim et al. | |
| 8,618,597 B2 | 12/2013 | Aritome | |
| 9,735,161 B2 * | 8/2017 | Wu .................... | H01L 27/10823 257/330 |
| 2008/0003743 A1 | 1/2008 | Lee | |
| 2011/0073930 A1 | 3/2011 | Choi et al. | |
| 2017/0069632 A1 | 3/2017 | Wu | |

FOREIGN PATENT DOCUMENTS

TW        I380398       12/2012
TW     201434153 A     9/2014

* cited by examiner

*Primary Examiner* — Calvin Lee
(74) *Attorney, Agent, or Firm* — TraskBritt

(57) ABSTRACT

A memory device and a method for fabricating the same are provided. The memory device includes a substrate, a first active region, a second active region, a gate structure, and a capping layer. The first active region and the second active region are alternately disposed in the substrate. The gate structure is disposed in the substrate and between the first active region and the second active region. The capping layer is over the gate structure to define a void therebetween.

20 Claims, 10 Drawing Sheets

MEMORY DEVICE AND FABRICATING METHOD THEREOF

CROSS-REFERENCE TO RELATED APPLICATION

This application is a continuation of U.S. patent application Ser. No. 14/848,357, filed Sep. 9, 2015, now U.S. Pat. No. 9,735,161, issued Aug. 15, 2017, the disclosure of which is hereby incorporated herein in its entirety by this reference.

BACKGROUND

A Dynamic Random Access Memory (DRAM) is an essential element in many electronic products. To increase component density and improve overall performance of DRAM, industrial manufacturers make constant efforts to reduce the sizes of transistors for the DRAM. However, as the transistor size is reduced, the device performance of such DRAM is still not satisfactory in advanced applications of technology.

Accordingly, an improved memory device and a fabricating method thereof are required.

SUMMARY

An aspect of the present disclosure provides a memory device. The memory device includes a substrate, a first active region, a second active region, a gate structure, and capping layer. The first active region and the second active region are alternately disposed in the substrate. The gate structure is disposed in the substrate and between the first active region and the second active region. The capping layer is over the gate structure to define a void therebetween.

In various embodiments of the present disclosure, the gate structure is a single-layer structure or a multi-layer structure.

In various embodiments of the present disclosure, the gate structure is a multi-layer structure including a first portion and a second portion embedded in the first portion.

In various embodiments of the present disclosure, the void contains a gaseous material.

In various embodiments of the present disclosure, the gaseous material has a dielectric constant of about 1.

In various embodiments of the present disclosure, the void is a vacuum.

In various embodiments of the present disclosure, the capping layer is made of oxide.

In various embodiments of the present disclosure, the capping layer includes a first part and a second part interposing the first part.

In various embodiments of the present disclosure, the first part of the capping layer is made of oxide, and the second part of the capping layer is made of nitride.

In various embodiments of the present disclosure, the memory device further includes a nitride layer over the capping layer.

Another aspect of the present disclosure provides a method for fabricating a memory device, and the method includes the following steps. A first active region and a second active region are alternately formed in a substrate. A gate structure is formed in the substrate and between the first active region and the second active region. A capping layer is formed over the gate structure to define a void therebetween.

In various embodiments of the present disclosure, forming the gate structure includes the following steps. A first portion is formed. A second portion is formed, which is embedded in the first portion.

In various embodiments of the present disclosure, forming the capping layer is to seal a space between the gate structure and the capping layer to define the void.

In various embodiments of the present disclosure, the capping layer is made of oxide.

In various embodiments of the present disclosure, forming the capping layer to define the void includes the following steps. A sacrificial structure is formed over the gate structure. A first part of the capping layer is formed over the sacrificial structure, and the first part of the capping layer has an opening. The sacrificial structure is removed. A second part of the capping layer is formed in the opening to form the capping layer and define the void.

In various embodiments of the present disclosure, forming the first part of the capping layer includes the following steps. A capping liner is deposited over the sacrificial structure. The capping liner is etched to form the first part of the capping layer having the opening.

In various embodiments of the present disclosure, the sacrificial structure is made of nitride or photoresist.

In various embodiments of the present disclosure, removing the sacrificial structure is performed by wet etching or photoresist stripping.

In various embodiments of the present disclosure, the first part of the capping layer is made of oxide, and the second part of the capping layer is made of nitride.

In various embodiments of the present disclosure, the method further includes depositing a nitride layer over the capping layer.

These and other features, aspects, and advantages of the present disclosure will become better understood with reference to the following description and appended claims.

It is to be understood that both the foregoing general description and the following detailed description are by way of example, and are intended to provide further explanation of the invention as claimed.

BRIEF DESCRIPTION OF THE DRAWINGS

The disclosure may be more fully understood by reading the following detailed description of the embodiment, with reference made to the accompanying drawings as follows.

DETAILED DESCRIPTION

Figure 1A:
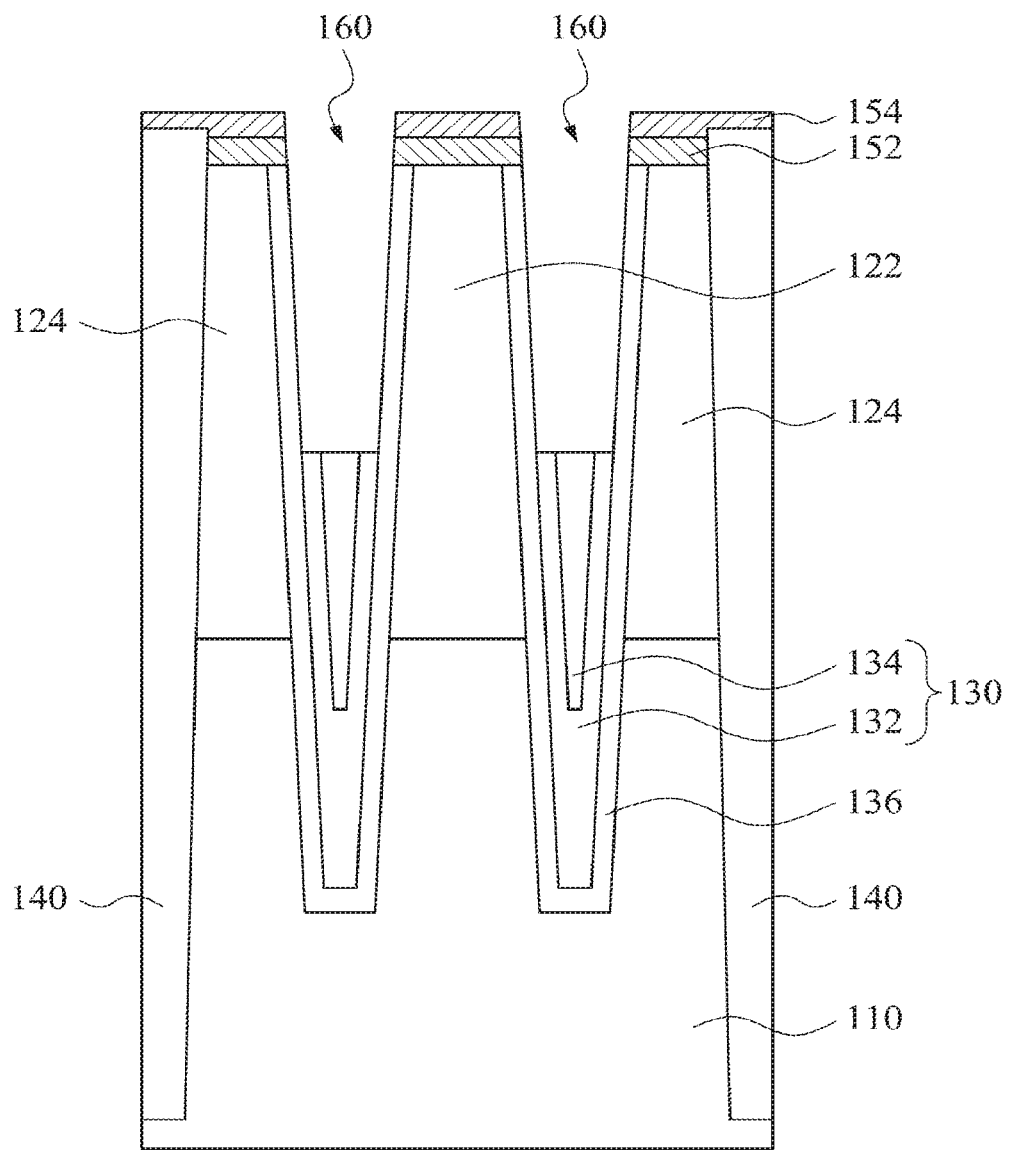
FIGS. 1A through 1D are cross-sectional views at various stages of fabricating a memory device in accordance with various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

As aforementioned problems, requirements in a memory device are becoming more challenging. For instance, the voltage difference between different active regions of a memory device becomes crucial as the device sizes decrease. Particularly, the different active regions are connected to different elements, and thus the different active regions have different electrical potentials. The memory cell junction would get electrical potential coupling from the active region having a lower potential. The low-field coupling from the active region would cause an electrical field increase in the cell junction and degrade gate-induced drain leakage (GIDL) performance, which inevitably degrades the performance of the memory device.

The present disclosure provides a memory device and a fabricating method thereof. The memory device of the present disclosure applies a void above a gate structure, and a first active region and a second active region. Therefore, the problems caused by the voltage difference can be alleviated, thereby improving the performance of the memory device.

FIGS. 1A through 1D are cross-sectional views at various stages of fabricating a memory device 100 in accordance with various embodiments of the present disclosure. FIGS. 1A through 1D are discussed collectively with the understanding that not all reference numerals are in all figures.

Figure 1B:
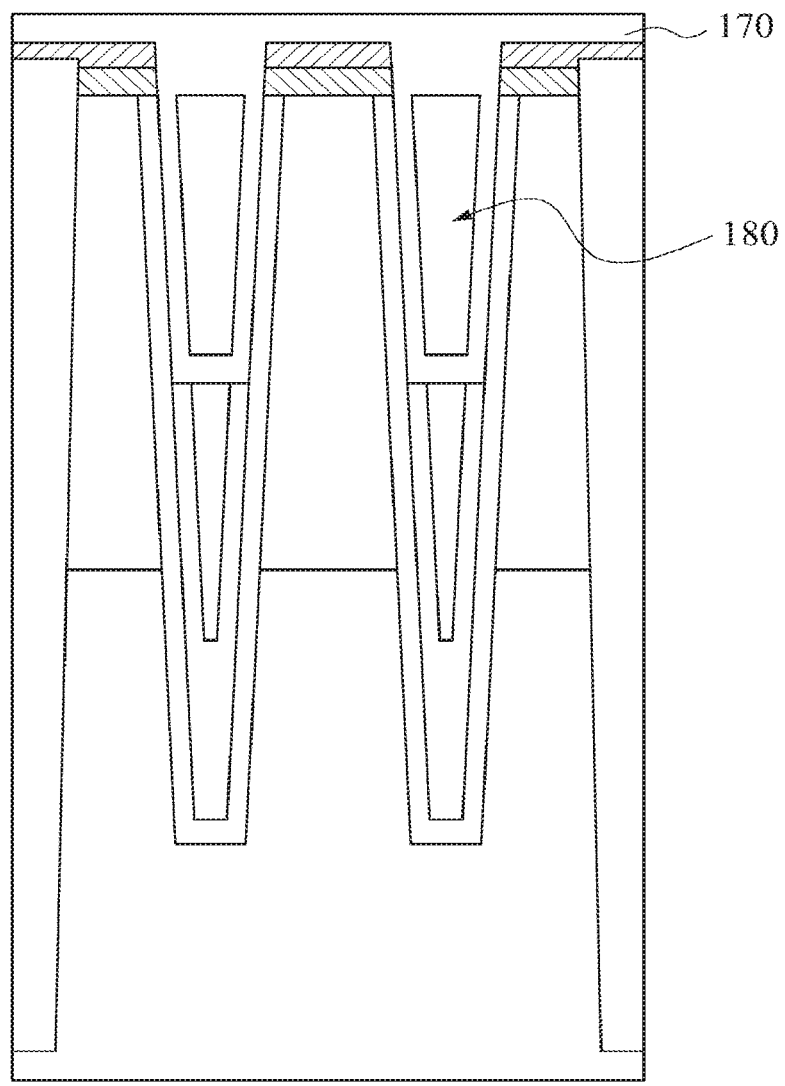
Figure 1C:
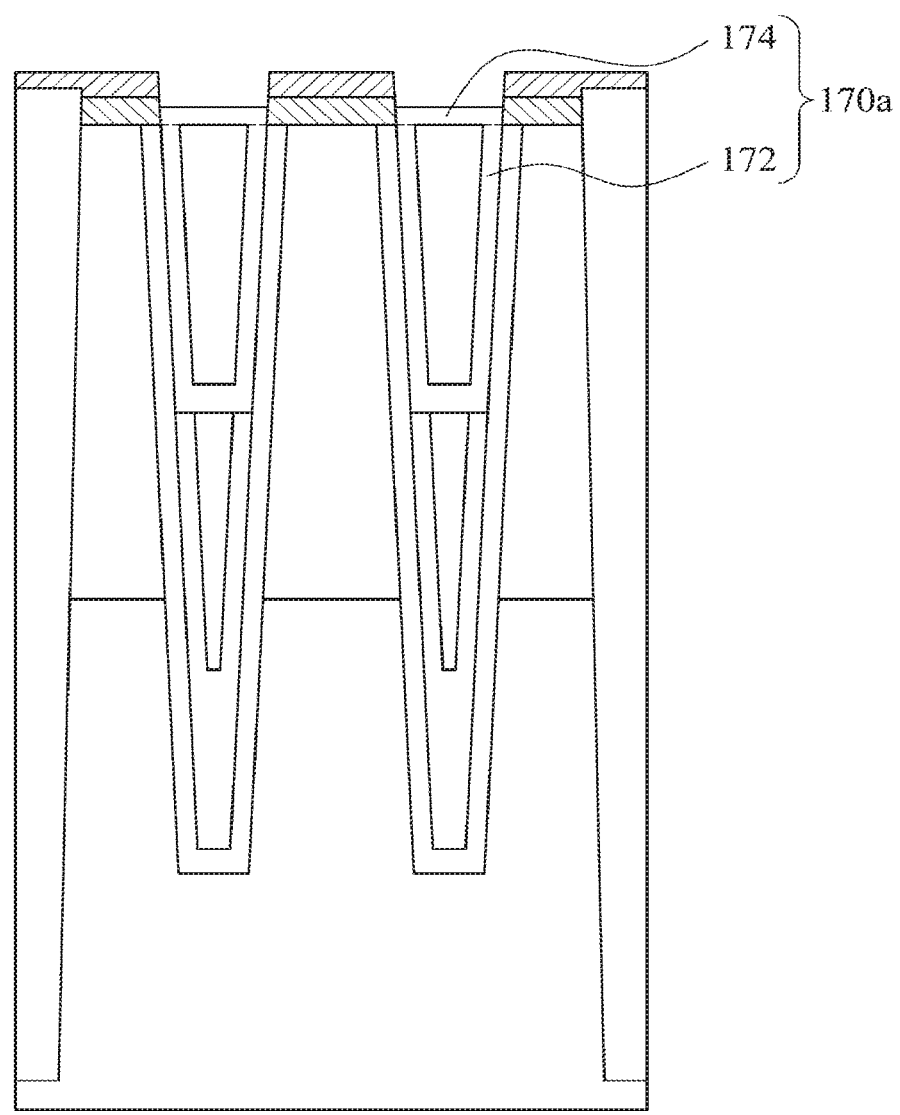
Figure 1D:
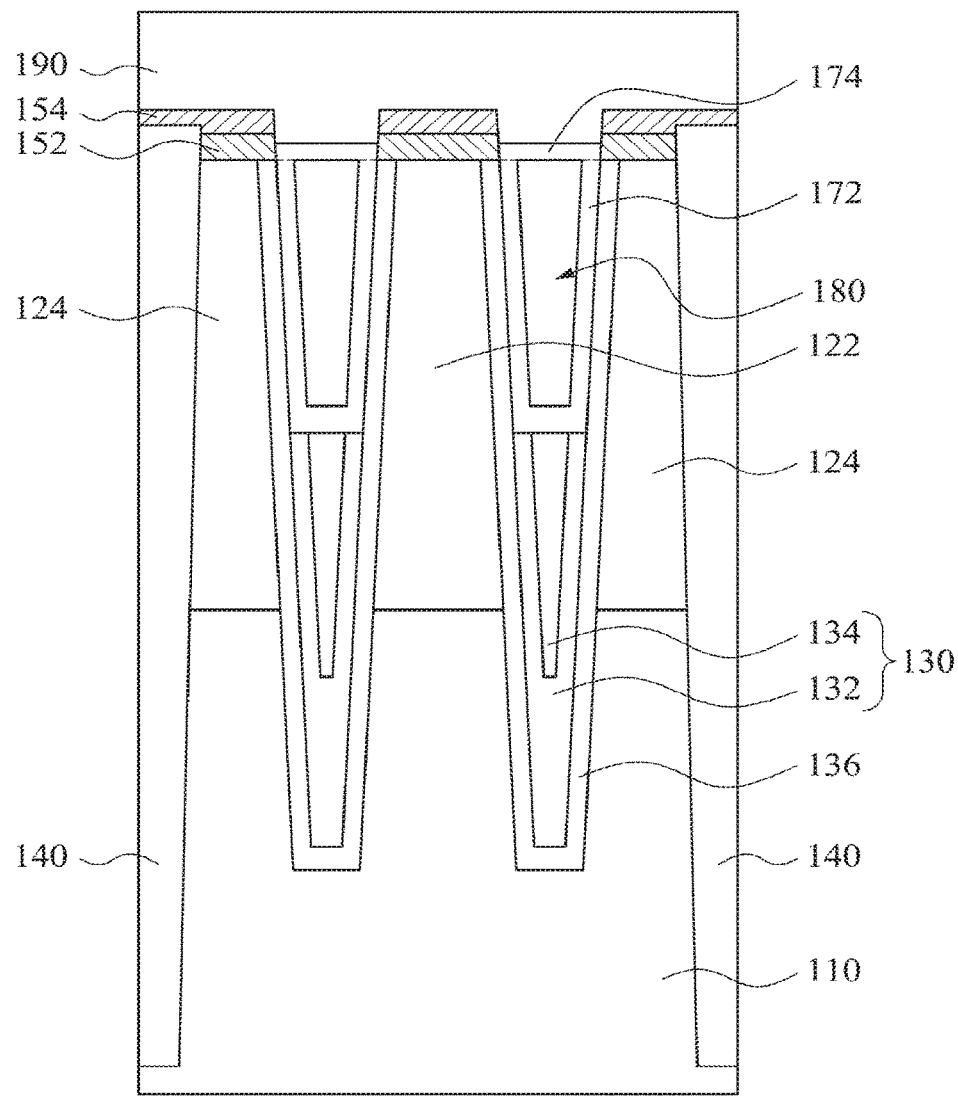

Referring to FIG. 1A, a substrate 110 is first provided for the fabrication of the memory device 100 (see FIG. 1D). A first active region 122 and second active regions 124 are formed alternately in the substrate 110, and gate structures 130 are formed in the substrate 110 and between the first active region 122 and the second active regions 124. Isolation structures 140 are formed in the substrate 110, and the first active region 122, the second active regions 124, and the gate structures 130 are disposed between two of the isolation structures 140.

The substrate 110 may be a silicon substrate, a silicon/germanium (SiGe) substrate, an epi-substrate, a silicon-on-insulator (SOI) substrate, etc.

The first active region 122 and the second active regions 124 may be formed by doping, such as n-doping or p-doping, depending on actual requirements. The first active region 122 and the second active regions 124 may respectively function as a source and a drain of the memory device 100, or vice versa. The first active region 122 and the second active regions 124 may be formed before or after the gate structures 130.

The gate structure 130 may be a single-layer structure or a multi-layer structure. For instance, the gate structure 130 includes a first portion 132 and a second portion 134 embedded in the first portion 132 as shown in FIG. 1A. The first portion 132 and the second portion 134 of the gate structure 130 may be independently made of tungsten (W), titanium nitride (TiN), tantalum nitride (TaN), tungsten nitride (WN), ruthenium (Ru), molybdenum nitride (MoN), TaN/TiN, WN/TiN, arsenic (As) doped polycrystalline silicon, tantalum (Ta), aluminum (Al), titanium (Ti), zirconium nitride (ZrN), or a combination thereof. In some embodiments, the first portion 132 is made of titanium nitride, and the second portion 134 is made of tungsten.

It is noteworthy that the gate structures 130 are disposed in the substrate 110, and thus the memory device 100 in the abovementioned embodiments can be called a "recess access device" (RAD). When a bias is applied to the gate structure 130, a channel may be formed in the substrate 110 and around the gate structure 130. Current may flow between the first active region 122 and the second active regions 124 through the channel.

In some embodiments, the gate structures 130 are formed by forming trenches in the substrate 110. Then, the first portions 132 and the second portions 134 of the gate structures 130 are formed by deposition in the bottom portions of the trenches. Accordingly, top surfaces of the gate structures 130 are lower than a top surface of the substrate 110. Unfilled portions of the trenches over the gate structures 130 are referred to as recesses 160 hereafter.

The memory device 100 applies a dual-gate system as shown in FIG. 1A, in which a memory cell of the memory device includes two gate structures, one first active region, and two second active regions. An isolation structure is disposed between two adjacent memory cells. The first active region is between the gate structures, and the second active regions are between the gate structures and the isolation structures.

In some embodiments, a gate dielectric layer 136 is formed between the gate structure 130 and the first active region 122 and between the gate structure 130 and the second active regions 124. The gate dielectric layer 136 may be formed by deposition before forming the gate structure 130. The material of the gate dielectric layer 136 may be any suitable dielectric material, such as oxide or nitride.

The isolation structures 140 may be shallow trench isolation (STI) structures. The isolation structures 140 may be disposed in the substrate 110 and between two adjacent memory cells to provide electrical isolation. In some embodiments, the isolation structures 140 are made of dielectric materials, such as silicon oxide or other suitable materials.

In some embodiments, a first oxide layer 152 and a second oxide layer 154 are deposited over the substrate 110 as shown in FIG. 1A. The first oxide layer 152 and the second oxide layer 154 function as dielectric layers.

Continuing in FIG. 1B, a top oxide 170 is formed on the sidewalls of the recesses 160 and over the gate structures 130. The recesses 160 are thus sealed to leave voids 180 over the gate structures 130.

The top oxide 170 may be formed by any suitable deposition process. Examples of the deposition process include, but are not limited to, chemical vapor deposition (CVD), physical vapor deposition (PVD), atomic layer deposition (ALD), and a combination thereof. A chemical-mechanical planarization (CMP) process may be optionally performed after the deposition.

The void 180 is not filled with any solid material. In some embodiments, the void 180 is a vacuum. In other embodiments, the void 180 contains a gaseous material. The gaseous material may be nitrogen, oxygen, air, or a mixture thereof. The air may be dry air, which represents air with no water vapor or having a low relative humidity (usually about 40%). It is noteworthy that the gaseous material within the voids 180 has a low dielectric constant (k). In some embodiments, the gaseous material has a dielectric constant of about 1. In contrast, a general memory device uses dielectric material to fill the space above a gate structure for isolation. The dielectric material usually has high dielectric constant, such as oxide (k is about 3.9) and nitride (k is about 7 to about 8), which may cause electrical potential coupling, resulting in leakage current. The memory device 100 applies the voids 180 between the first active region 122 and the second active regions 124, and over the gate structures 130 as caps, the voids 180 having a lower dielectric constant. Hence, the electrical potential coupling can be reduced so as to prevent leakage current, thereby improving the performance of the memory device 100.

It is noteworthy that the gate structures 130 are sealed so as to leave the voids 180 thereon. This is because the deposition rate of the material of the top oxide 170 is faster at corners of the recesses 160, and the materials at the corners are bridged before the bottom of the recesses 160 are filled. That is, the openings of the recesses 160 are sealed to form the voids 180, which are the space between the bridged top oxide and the gate structures 130, which are sealed.

Referring to FIG. 1C, the top oxide 170 is etched to form an etched top oxide 170a, and each of which includes a liner 172 on the sidewalls of the recess 160 and a capping layer 174 over the gate structure 130 and bridging the sidewalls of the recess 160. The liner 172 and the capping layer 174 are defined by a dotted line as shown in FIG. 1C.

It is noteworthy that other methods can be applied to form voids over a gate structure. For instance, the capping layer may be directly formed over the gate structure without the liner to bridge sidewalls of the recesses and leave voids between the capping layer and the gate structure.

Referring to FIG. 1D, a nitride layer 190 is deposited over the capping layer 174 and the second oxide layer 154, and the memory device 100 is thereby formed. The nitride layer 190 may be formed by any suitable deposition process, such as those exemplified above. A CMP process may be optionally performed after the deposition. In some embodiments, the nitride layer 190 is made of silicon nitride (SiN).

The formed memory device 100, in accordance with various embodiments of the present disclosure, includes the substrate 110, the first active region 122, the second active regions 124, the gate structures 130, the isolation structures 140, the first oxide layer 152, the second oxide layer 154, the liners 172, the capping layers 174, the voids 180, and the nitride layer 190. The first active region 122 and the second active regions 124 are alternately disposed in the substrate 110. The gate structures 130 are disposed in the substrate 110 and between the first active region 122 and the second active regions 124. The isolation structures 140 are disposed in the substrate 110, and the first active region 122, the second active regions 124, and the gate structures 130 are disposed between two of the isolation structures 140. The first oxide layer 152 and the second oxide layer 154 are disposed over the substrate 110. The liners 172 and the capping layers 174 are integrally formed, and are over gate structures 130. The voids 180 are defined by the capping layers 174 and the gate structures 130, and are the space therebetween. The nitride layer 190 is disposed over the capping layers 174 and the second oxide layer 154.

The memory device of the present disclosure applies a novel structure, which includes the void over the gate structure for isolation. The void may be a vacuum, or may include low-k gaseous material, and is disposed between the first active region and the second active regions of the memory device. As a result, the electrical potential coupling can be reduced, thereby improving the performance of the memory device. Further, the void provides better stress relax function than a structure filled with solid material.

FIGS. 2A through 2F are cross-sectional views at various stages of fabricating a memory device 200 in accordance with various embodiments of the present disclosure. FIGS. 2A through 2F are discussed collectively with the understanding that not all reference numerals are in all figures.

Figure 2A:
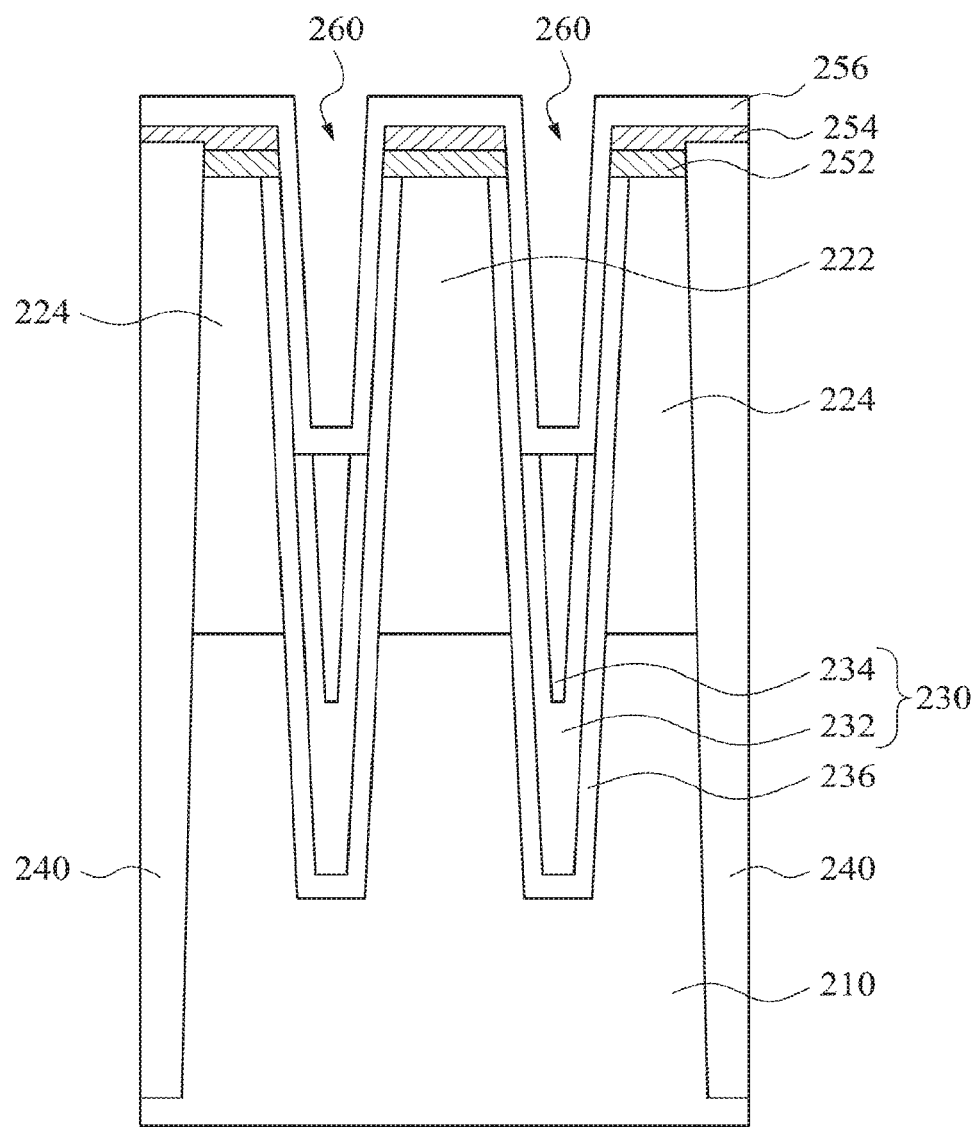
FIGS. 2A through 2F are cross-sectional views at various stages of fabricating a memory device in accordance with various embodiments of the present disclosure.
Figure 2B:
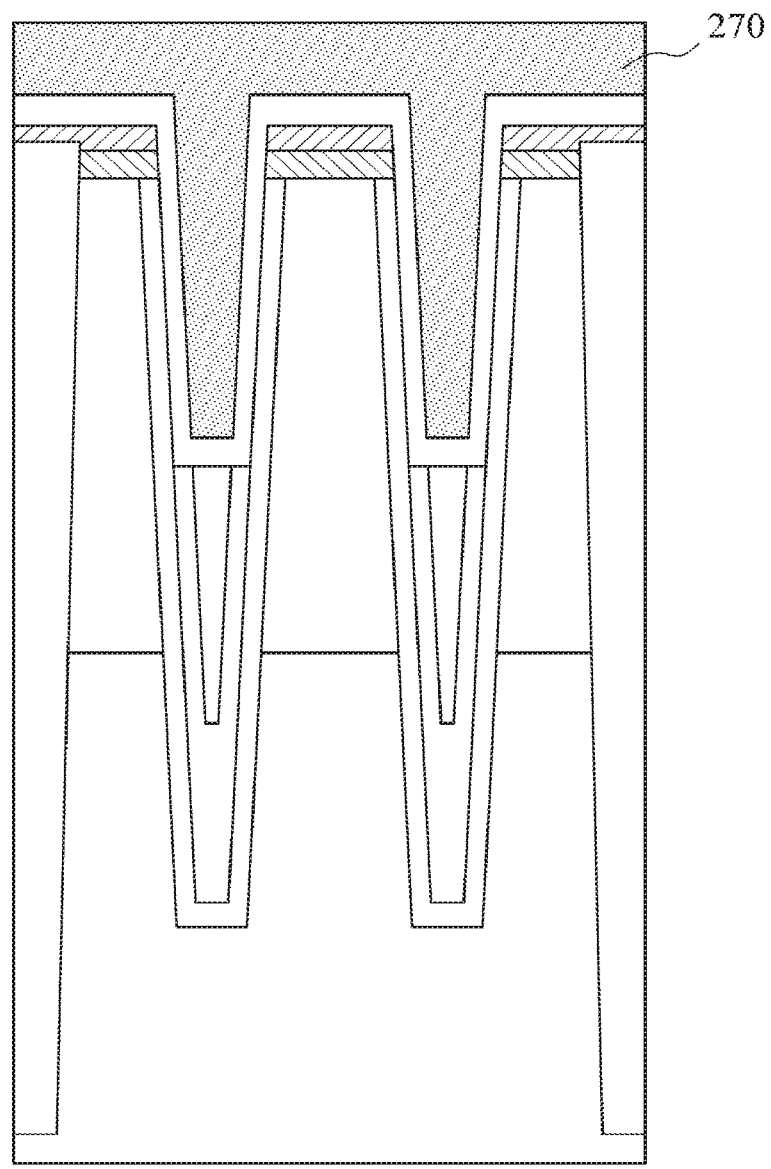
Figure 2C:
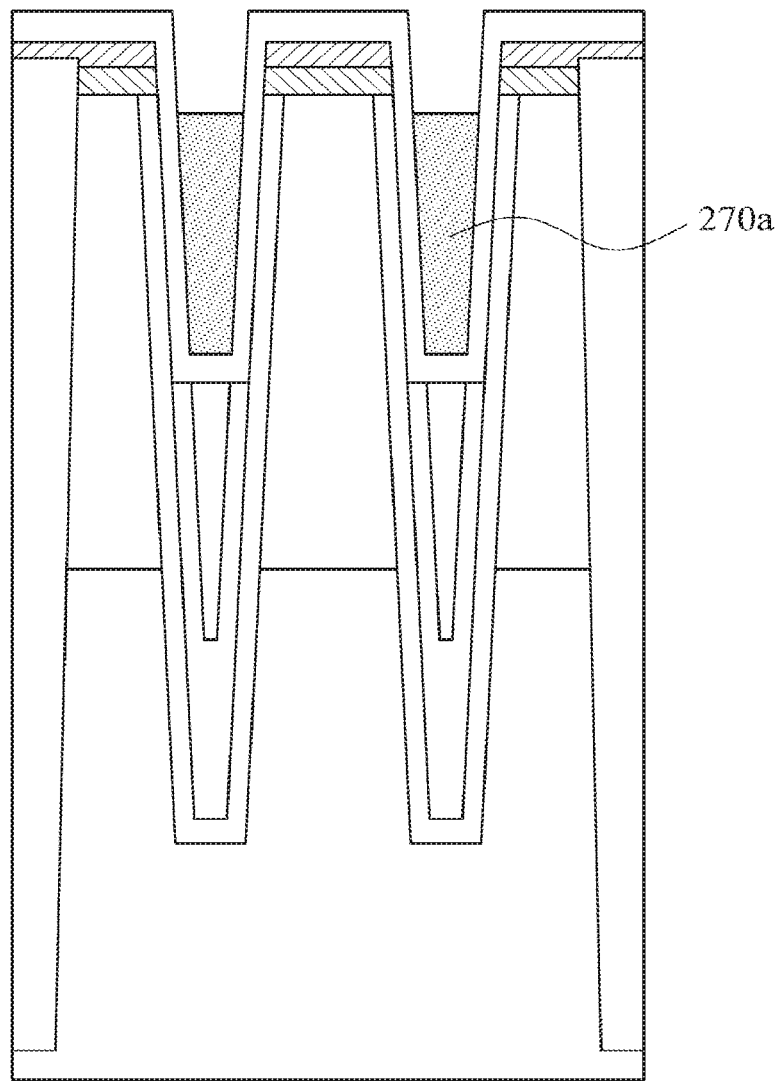
Figure 2D:
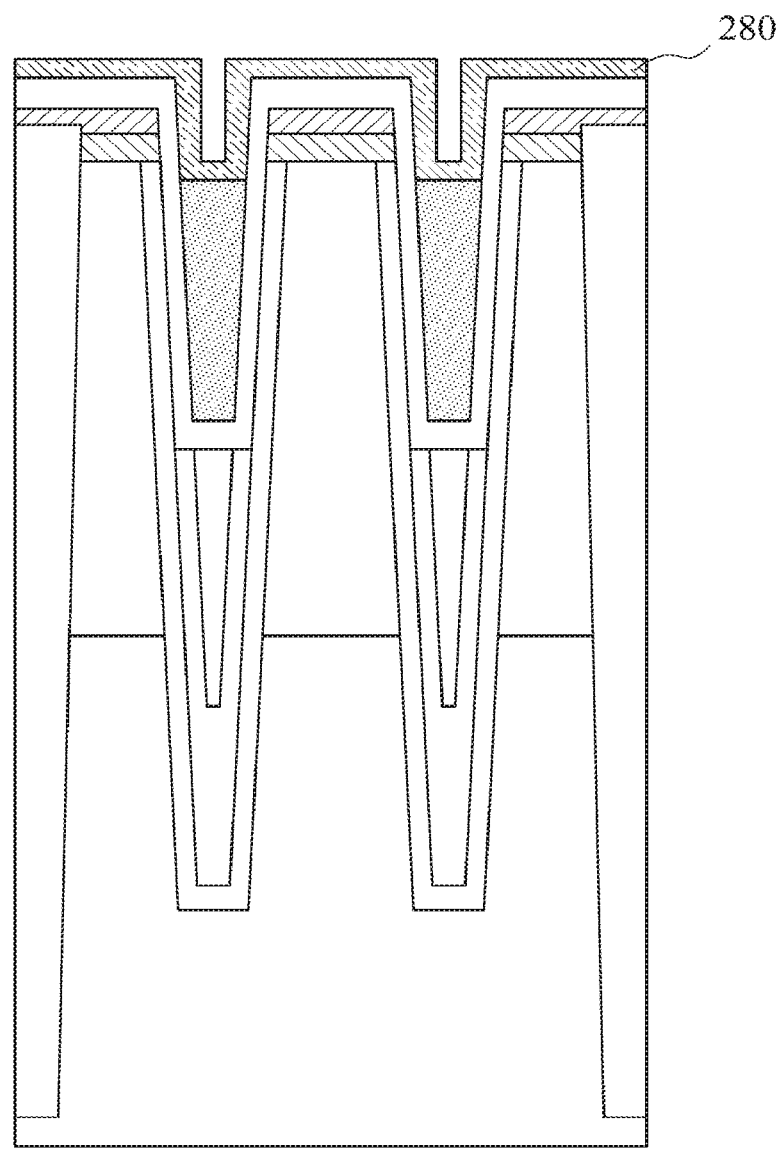
Figure 2E:
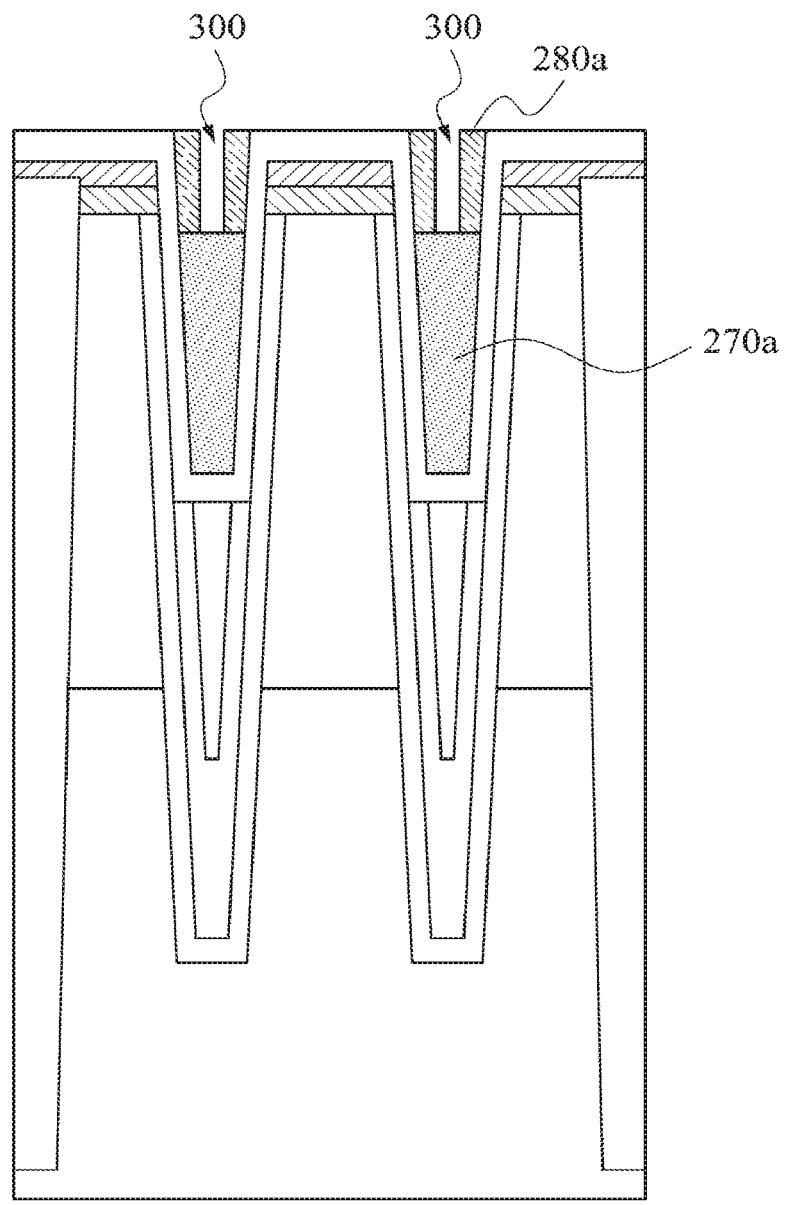
Figure 2F:
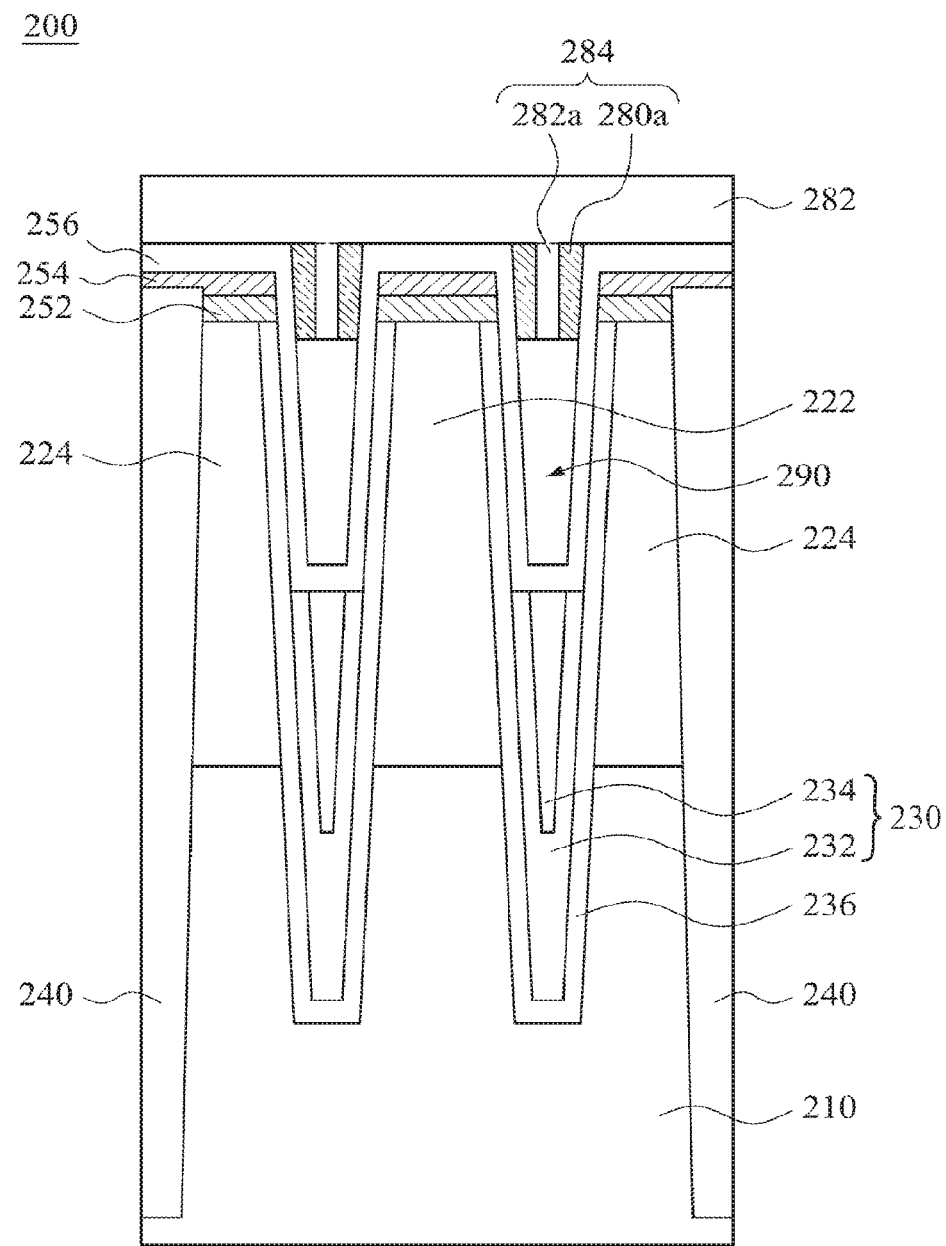

Referring to FIG. 2A, a substrate 210 is first provided for the fabrication of the memory device 200 (see FIG. 2F). A first active region 222 and second active regions 224 are formed alternately in the substrate 210, and gate structures 230 are formed in the substrate 210 and between the first active region 222 and the second active regions 224. A gate dielectric layer 236 is formed between the gate structure 230 and the first active region 222 and between the gate structure 230 and the second active region 224. Isolation structures 240 are formed in the substrate 210, and the first active region 222, the second active regions 224, and the gate structures 230 are disposed between two of the isolation structures 240. A first oxide layer 252 and a second oxide layer 254 are deposited over the substrate 210. An oxide liner 256 is disposed over the gate structures 230 and the second oxide layer 254.

The first active region 222 and the second active region 224 may respectively function as a source and a drain of the memory device 200, or vice versa, and may be n-doped or p-doped, depending on actual requirements.

The gate structure 230 may be a single-layer structure or a multi-layer structure. As shown in FIG. 2A, the gate structure 230 includes a first portion 232 and a second portion 234 embedded in the first portion 232. Examples of the material of the first portion 232 and the second portion 234 may be referred to those exemplified for the first portion 132 and the second portion 134 of FIG. 1A. In some embodiments, the first portion 232 is made of titanium nitride, and the second portion 234 is made of tungsten.

In some embodiments, the gate structures 230 are formed by forming trenches in the substrate 210. Then, the first portions 232 and the second portions 234 of the gate structures 230 are formed by deposition in the bottom portions of the trenches. Accordingly, top surfaces of the gate structures 230 are lower than a top surface of the substrate 210. In some embodiments, the gate dielectric layer 236 is formed by deposition before forming the gate structures 230. The gate dielectric layer 236 may be made of any suitable dielectric material, such as oxide or nitride.

The oxide liner 256 is disposed over the second oxide layer 254 and the gate structures 230 to define recesses 260. The oxide liner 256 may be deposited by any suitable process, such as those exemplified above. In some embodiments, the oxide liner 256 is deposited accompanied by an etching process, which is used to remove excess oxide at corners of the recesses 260 due to different deposition rates, so as to prevent the corners from being bridged and to define the recesses 260.

Other features such as materials, forming manners, and functions of the substrate 210, the first active region 222, the second active regions 224, the gate structures 230, the gate dielectric layer 236, the isolation structures 240, the first oxide layer 252, the second oxide layer 254, may be referred to those exemplified for the counterparts of FIG. 1A.

Continuing in FIG. 2B, a sacrificial layer 270 is deposited over the oxide liner 256 and the gate structures 230 to fill the recesses 260. The sacrificial layer 270 may be deposited by any deposition process exemplified above, and a CMP process is optionally performed after the deposition. The material of the sacrificial layer 270 is different from that of the oxide liner 256 considering that the sacrificial layer 270 would be removed in the subsequent step, while not removing the oxide liner 256. Preferably, the sacrificial layer 270 would be removed by a process having high selectivity of the material of the sacrificial layer 270 to oxide, which is the material of the oxide liner 256. In some embodiments, the sacrificial layer 270 is made of organic compound, nitride or photoresist. The photoresist is a light-sensitive material, such as polymeric resin.

Referring to FIG. 2C, the sacrificial layer 270 is etched to leave sacrificial structures 270a over the oxide liner 256 and the gate structures 230. The sacrificial layer 270 may be etched by any suitable process, such as dry etch and wet etch.

Continuing in FIG. 2D, a capping liner 280 is deposited over the oxide liner 256 and the sacrificial structures 270a. The capping liner 280 may be deposited by any deposition process exemplified above, and may be made of oxide.

Referring to FIG. 2E, the capping liner 280 is etched to form first parts 280a of capping layers 284. Each first part 280a of the capping layer 284 has an opening 300, and is over the sacrificial structure 270a. In some embodiments, the capping liner 280 is etched by a dry etching process.

Continuing in FIG. 2F, the sacrificial structures 270a are removed, and a nitride layer 282 is deposited over the oxide liner 256 and fills the openings 300. Portions of the nitride layer 282 that fill the openings 300 are second parts 282a of the capping layers 284, and are defined by dotted lines as shown in FIG. 2F. The first parts 280a of the capping layer 284 are interposed by the second part 282a of the capping layer 284. Accordingly, the capping layers 284 are formed, and voids 290 are defined. In some embodiments, the first parts 280a of the capping layer 284 are made of oxide, and the second part 282a of the capping layer 284 is made of nitride.

In some embodiments, the sacrificial structures 270a are removed by wet etching or photoresist stripping depending on the material of the sacrificial structures 270a. The nitride layer 282 may be formed by any suitable deposition process, such as those exemplified above. A CMP process may be optionally performed after the deposition. In some embodiments, the material of nitride layer 282 is silicon nitride (SiN).

The formed memory device 200 includes the substrate 210, the first active region 222, the second active regions 224, the gate structures 230, the gate dielectric layer 236, the isolation structures 240, the first oxide layer 252, the second oxide layer 254, the oxide liner 256, the nitride layer 280, the capping layers 284, and the voids 290. The first active region 222 and the second active regions 224 are alternately disposed in the substrate 210. The gate structures 230 are disposed in the substrate 210 and between the first active region 222 and the second active regions 224, and include the first portion 232 and the second portion 234 embedded in the first portion 232. The gate dielectric layer 236 is deposited between the gate structure 230 and the first active region 222 and between the gate structure 230 and the second active region 224. The isolation structures 240 are disposed in the substrate 210, and the first active region 222, the second active regions 224, and the gate structures 230 are disposed between two of the isolation structures 240. The first oxide layer 252 and the second oxide layer 254 are disposed over the substrate 210. The oxide liner 256 is disposed over the second oxide layer 254 and the gate structures 230. The capping layers 284 are disposed over the gate structures 230 and the oxide liner 256 to define the voids 290, and each of which includes the first part 280a and the second part 282a interposing the first part 280a. The nitride layer 282 is disposed over the capping layers 284 and the second oxide layer 254.

The difference between the embodiments shown in FIGS. 2A through 2F and FIGS. 1A through 1D is the methods of forming the voids 180 and 290. This difference does not affect the functions of other components and steps in the embodiments. Therefore, the memory device 200 and the fabricating method thereof have the same functions and advantages as the memory device 100 shown in FIGS. 1A through 1D.

The embodiments of the present disclosure discussed above have advantages over existing memory devices and processes, and the advantages are summarized below. The memory device of the present disclosure is a novel structure, which applies a void as the cap for the gate structure to replace the dielectric material used in a general structure. As a result, the electrical potential coupling between the active regions can be effectively reduced, and lower electrical potential can get cell junction electrical and GIDL improvement. Further, the void with gaseous material provides better stress relax function than a general structure filled with solid material. Accordingly, the performance of the memory device can be improved.

It is noteworthy that the foregoing operating sequences for the method of fabricating the memory device are merely examples and are not intended to be limiting, and various changes, substitutions, and alterations may be made without departing from the spirit and scope of the present disclosure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for fabricating a memory device, the method comprising:
   forming a first active region, and a second active region laterally spaced therefrom;
   forming a gate structure between the first active region and the second active region; and
   forming a capping material extending between the first active region and the second active region, the capping material being positioned over the gate structure and sealing a space between the gate structure and the capping material to define a sealed void comprising:
      forming a dielectric material on sidewalls of a recess and over the gate structure to form a liner; and
      forming the dielectric material bridging the sidewalls of the recess to seal the space between the gate structure and the capping material.

2. The method of claim 1, wherein sealing the space between the gate structure and the capping material to define the sealed void further comprises filling the sealed void with a gaseous material comprising at least one of nitrogen, oxygen, air, or a combination thereof.

3. The method of claim 1, further comprising forming a gate dielectric material between the gate structure and each of the first active region and the second active region, wherein the gate dielectric material comprises at least one of an oxide or a nitride.

4. The method of claim 1, further comprising forming at least two adjacent memory cells and forming an isolation structure therebetween, wherein forming the gate structure comprises forming two gate structures between two adjacent isolation structures.

5. The method of claim 1, wherein forming the capping material further comprises removing at least a portion of the dielectric material.

6. The method of claim 1, wherein forming the capping material comprises integrally forming the liner and the capping material.

7. The method of claim 1, wherein forming the gate structure comprises forming a first portion and a second portion of a multi-layer gate structure in the recess of a substrate.

8. The method of claim 7, further comprising forming a first oxide material over the substrate and a second oxide material over the first oxide material.

9. The method of claim 8, further comprising forming a nitride material over at least the capping material.

10. The method of claim 9, wherein forming the nitride material over at least the capping material comprises forming the nitride material over the capping material and the second oxide material.

11. A memory device, comprising:
a first active region, and a second active region laterally spaced therefrom;
a gate structure at least partially located between the first active region and the second active region; and
a capping material located vertically over the gate structure and extending from the first active region to the second active region, the capping material sealing a space between the gate structure and the capping material to define a sealed void.

12. The memory device of claim 11, wherein the first active region comprises one of an n-doped region or a p-doped region and the second active region comprises the other of the n-doped region or the p-doped region.

13. The memory device of claim 11, wherein the first active region comprises one of a source region or a drain region and the second active region comprises the other of the source region or the drain region.

14. The memory device of claim 11, wherein the gate structure comprises a multi-layer structure including a first portion and a second portion embedded within the first portion.

15. The memory device of claim 14, wherein the first portion comprises titanium nitride and the second portion comprises tungsten.

16. The memory device of claim 11, further comprising a recess extending between the first active region and the second active region and into at least a portion of a substrate.

17. The memory device of claim 16, wherein an upper surface of the gate structure is lower than an upper surface of the substrate.

18. The memory device of claim 16, wherein the gate structure is at least partially located in the recess of the substrate.

19. The memory device of claim 16, further comprising isolation structures located in the substrate, wherein the isolation structures comprise a dielectric material.

20. The memory device of claim 19, wherein the first active region, the gate structure, and two second active regions are located between two isolation structures.

* * * * *

UNITED STATES PATENT AND TRADEMARK OFFICE
CERTIFICATE OF CORRECTION

PATENT NO. : 10,020,310 B2
APPLICATION NO. : 15/671471
DATED : July 10, 2018
INVENTOR(S) : Wu Page 1 of 1

It is certified that error appears in the above-identified patent and that said Letters Patent is hereby corrected as shown below:

In the Specification

Column 1, Line 13, Insert subtitle prior to the first paragraph
--Description of Related Art--

Signed and Sealed this
Twenty-first Day of August, 2018

Andrei Iancu
*Director of the United States Patent and Trademark Office*